United States Patent
Lin et al.

(10) Patent No.: US 10,943,573 B2
(45) Date of Patent: Mar. 9, 2021

(54) AUDIO OUTPUT MONITORING FOR FAILURE DETECTION OF WARNING SOUND PLAYBACK

(71) Applicant: MediaTek Inc., Hsinchu (TW)

(72) Inventors: Yu-Hsiang Lin, Hsinchu (TW);
Fang-Shan Yang, Hsinchu (TW);
Chih-Hsing Chu, Hsinchu (TW);
Ching-He Sun, Hsinchu (TW)

(73) Assignee: MediaTek Inc.

( * ) Notice: Subject to any disclaimer, the term of this patent is extended or adjusted under 35 U.S.C. 154(b) by 0 days.

(21) Appl. No.: 16/415,040

(22) Filed: May 17, 2019

(65) Prior Publication Data
US 2019/0355334 A1 Nov. 21, 2019

Related U.S. Application Data

(60) Provisional application No. 62/672,616, filed on May 17, 2018.

(51) Int. Cl.
*G10H 1/00* (2006.01)
*B60W 50/14* (2020.01)
*H03M 13/09* (2006.01)

(52) U.S. Cl.
CPC .......... *G10H 1/0041* (2013.01); *B60W 50/14* (2013.01); *G10H 1/0083* (2013.01); *H03M 13/09* (2013.01); *B60W 2050/143* (2013.01)

(58) Field of Classification Search
CPC ............... H04L 63/0428; H04L 9/3236; H04L 29/06027; H04L 2209/20; H04L 1/0061; H04L 1/0072; H04L 67/06; H04L 2209/34; H04L 43/0847; G06F 11/0751; G06F 11/0769; G06F 11/0772; G06F 11/08; G10H 1/0066; G10H 2240/311; G10H 2250/611; G10H 2250/571; G10H 2250/621; G10H 1/0041; G10H 1/0083; H04B 1/70735; H04H 60/23; H03M 7/30; H03M 13/093; H03M 13/11; H03M 13/03; H03M 13/09; H03M 13/15
See application file for complete search history.

(56) References Cited

U.S. PATENT DOCUMENTS 5,742,695 A * 4/1998 Suggs .................... G06F 7/026
381/104
5,991,693 A * 11/1999 Zalewski ............... G09B 5/065
345/156

(Continued)

OTHER PUBLICATIONS

European Patent Office, European Search Report for European Patent Application No. EP19175123.9, dated Oct. 11, 2019.

*Primary Examiner* — Marlon T Fletcher
(74) *Attorney, Agent, or Firm* — Han IP PLLC; Andy M. Han

(57) ABSTRACT

Various examples and techniques pertaining to audio output monitoring for failure detection of warning sound playback are described. In one aspect, audio data, which includes a plurality of bits of a first sound sample and one or more control bits for integrity check, is retrieved from a data storage. The audio data is processed by: (i) performing an integrity check on the first sound sample based on the one or more control bits, and (ii) playing back a first sound using the first sound sample. The first sound can be a warning sound in automobile applications.

20 Claims, 11 Drawing Sheets

(56) References Cited

U.S. PATENT DOCUMENTS

| | | | | |
|---|---|---|---|---|
| 6,792,542 B1* | 9/2004 | Lee | ................ | G10L 19/018 375/E1.002 |
| 6,922,722 B1* | 7/2005 | Mann | ................ | H04L 67/34 709/217 |
| 7,318,089 B1* | 1/2008 | Stachura | ................ | H04L 41/0672 709/220 |
| 8,644,341 B1* | 2/2014 | Petranovich | ................ | H04L 1/0061 370/474 |
| 2002/0147590 A1* | 10/2002 | Sydanmaa | ................ | G10L 19/005 704/265 |
| 2004/0042420 A1* | 3/2004 | Agarwal | ................ | H03M 13/29 370/310.1 |
| 2005/0179567 A1* | 8/2005 | Apostolopoulos | ................ | H04N 21/235 341/50 |
| 2005/0179568 A1* | 8/2005 | Wee | ................ | H04N 21/435 341/50 |
| 2005/0180563 A1* | 8/2005 | Apostolopoulos | ................ | H04N 19/647 380/28 |
| 2005/0182855 A1* | 8/2005 | Apostolopoulos | ................ | H04N 19/63 709/247 |
| 2005/0182972 A1* | 8/2005 | Apostolopoulos | ................ | H04N 21/84 726/19 |
| 2005/0183118 A1* | 8/2005 | Wee | ................ | H04N 21/23476 725/46 |
| 2010/0050054 A1* | 2/2010 | Abraham | ................ | H04L 1/0072 714/776 |
| 2010/0142552 A1 | 6/2010 | Dietl et al. | | |
| 2011/0227756 A1 | 9/2011 | Otero et al. | | |
| 2014/0331111 A1* | 11/2014 | Kroeger | ................ | G06F 11/1004 714/807 |
| 2015/0325243 A1* | 11/2015 | Grant | ................ | G10L 19/002 704/229 |
| 2016/0204908 A1* | 7/2016 | Rafique | ................ | H04L 1/0014 370/252 |
| 2016/0261375 A1* | 9/2016 | Roethig | ................ | H04L 7/041 |
| 2019/0007170 A1* | 1/2019 | Sun | ................ | H04W 72/042 |
| 2019/0278733 A1* | 9/2019 | Kessler | ................ | H04L 12/4035 |
| 2019/0355334 A1* | 11/2019 | Lin | ................ | G10L 19/167 |
| 2020/0027465 A1* | 1/2020 | Lin | ................ | B60Q 9/00 |

\* cited by examiner

AUDIO OUTPUT MONITORING FOR FAILURE DETECTION OF WARNING SOUND PLAYBACK

CROSS REFERENCE TO RELATED PATENT APPLICATION(S)

The present disclosure is part of a non-provisional application claiming the priority benefit of U.S. Patent Application No. 62/672,616, filed on 17 May 2018. The content of aforementioned application is herein incorporated by reference in its entirety.

TECHNICAL FIELD

The present disclosure is generally related to audio output monitoring and, more particularly, to audio output monitoring for failure detection of warning sound playback.

BACKGROUND

Unless otherwise indicated herein, approaches described in this section are not prior art to the claims listed below and are not admitted as prior art by inclusion in this section.

In present days, with the prevalence of a variety of electronic devices and intelligent/smart devices, different audio sounds can be output by the devices to provide different types of notification the user. In the context of automobiles (interchangeably referred to as "vehicles" herein), electric vehicle warning sounds are sounds designed to alert pedestrians to the presence of an approaching vehicle (e.g., an electric vehicle or a hybrid-electric vehicle). As another example, a vehicle may play back a special sound to warn or alert its driver of a certain condition (e.g., blinker light being turned on, fuel level being too low, vehicle being too close to an object, seat belt being unbuckled, and so on).

SUMMARY

The following summary is illustrative only and is not intended to be limiting in any way. That is, the following summary is provided to introduce concepts, highlights, benefits and advantages of the novel and non-obvious techniques described herein. Select implementations are further described below in the detailed description. Thus, the following summary is not intended to identify essential features of the claimed subject matter, nor is it intended for use in determining the scope of the claimed subject matter.

An object of the present disclosure is to propose solutions, schemes, concepts, designs, techniques and examples pertaining to audio output monitoring for failure detection of warning sound playback. Thus, integrity check on audio data being played may be enabled to detect any faults (e.g., corrupt data bit(s)) therein to ensure that a given sound to be played back matches what is intended.

In one aspect, a method may involve retrieving first audio data from a data storage. The first audio data may include a plurality of bits of a first sound sample and one or more control bits for integrity check. The method may also involve processing the first audio data by: (i) performing an integrity check on the first sound sample based on the one or more control bits; and (ii) playing back a first sound using the first sound sample.

In one aspect, an apparatus may include a data storage and a circuit coupled to the data storage. The data storage may store first audio data and second audio data different from the first audio data. The first audio data may include a plurality of bits of a first sound sample and one or more control bits for integrity check. During operation, the circuit may retrieve the first audio data from the data storage and process the first audio data by: (i) performing an integrity check on the first sound sample based on the one or more control bits; and (ii) playing back a first sound using the first sound sample.

It is noteworthy that, although description provided herein may be in the context of certain error detection techniques such as cyclic redundancy check (CRC), the proposed concepts, schemes and any variation(s)/derivative(s) thereof may be implemented in, for and by other types of error detection techniques whichever applicable. Thus, the scope of the present disclosure is not limited to the examples described herein.

BRIEF DESCRIPTION OF THE DRAWINGS

The accompanying drawings are included to provide a further understanding of the disclosure and are incorporated in and constitute a part of the present disclosure. The drawings illustrate implementations of the disclosure and, together with the description, serve to explain the principles of the disclosure. It is appreciable that the drawings are not necessarily in scale as some components may be shown to be out of proportion than the size in actual implementation in order to clearly illustrate the concept of the present disclosure.

DETAILED DESCRIPTION OF PREFERRED IMPLEMENTATIONS

Detailed embodiments and implementations of the claimed subject matters are disclosed herein. However, it shall be understood that the disclosed embodiments and implementations are merely illustrative of the claimed subject matters which may be embodied in various forms. The present disclosure may, however, be embodied in many different forms and should not be construed as limited to the exemplary embodiments and implementations set forth herein. Rather, these exemplary embodiments and implementations are provided so that description of the present disclosure is thorough and complete and will fully convey the scope of the present disclosure to those skilled in the art. In the description below, details of well-known features and techniques may be omitted to avoid unnecessarily obscuring the presented embodiments and implementations.

Overview

Under various proposed schemes in accordance with the present disclosure, control bits (e.g., enable bit, reset bit and transfer bit) may be embedded in audio data which is to be played back as warning sound. Under the various proposed schemes, expected inspection results (e.g., CRC checksum results) may be provided either in-band or out-of-band to a component verifying checksum results. That is, safety-related audio data with checksum control bits may be calculated and/or accumulated and then compared against a predefined correct (or golden) CRC checksum value for failure detection.

Figure 1:
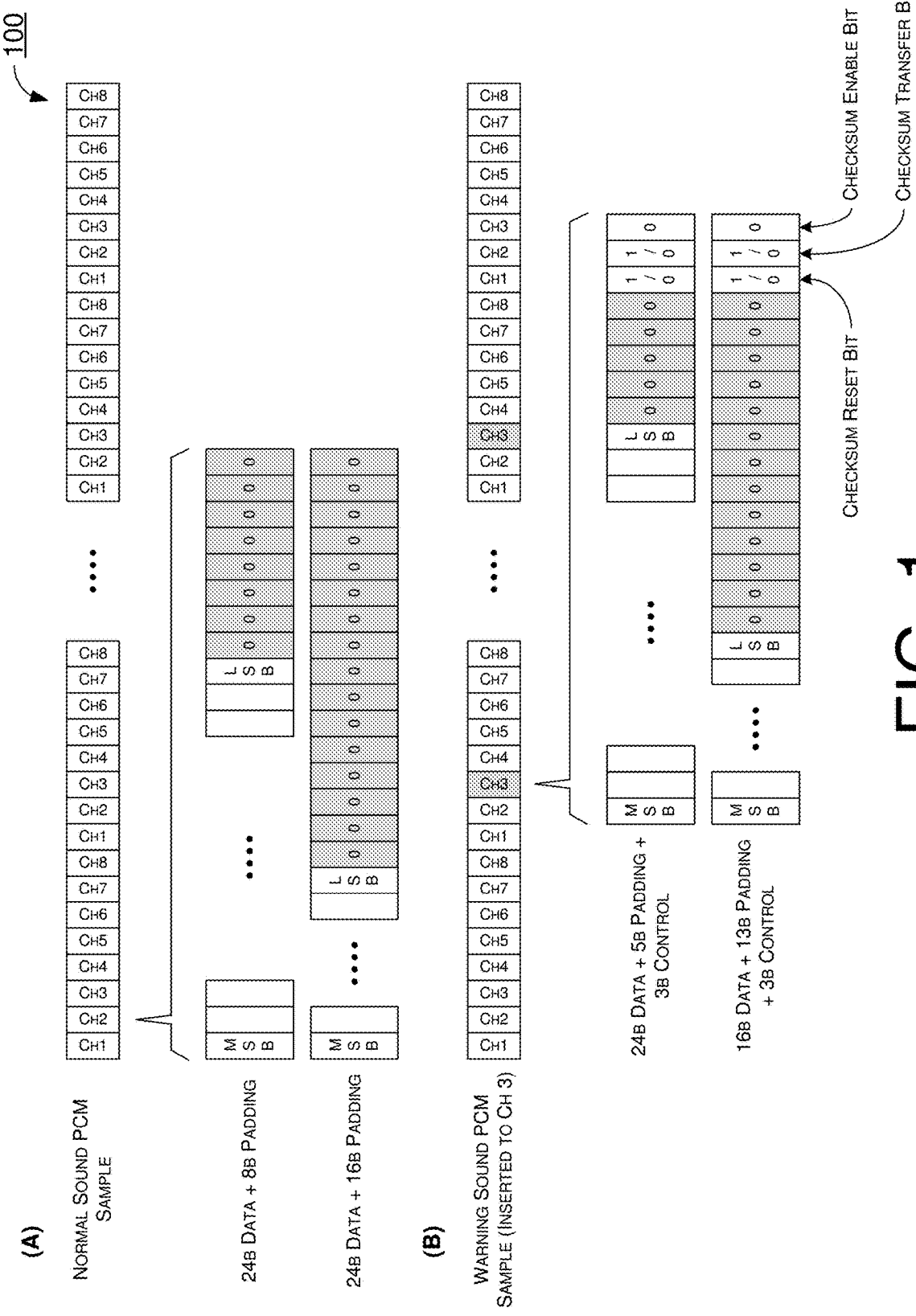
FIG. 1 is a diagram of an example scheme in accordance with an implementation of the present disclosure.

FIG. 1 illustrates an example scheme 100 in accordance with an implementation of the present disclosure. Specifically, part (A) of FIG. 1 shows audio pulse-code modulation (PCM) data of a normal sound sample, and part (B) of FIG. 1 shows audio PCM data of a special sound sample under a proposed scheme in accordance with an implementation of the present disclosure. Referring to part (A) of FIG. 1, for audio PCM data containing normal sound samples for playback of a normal sound, each 32-bit frame of the audio PCM data may be padded, with 16 or 24 most-significant bits (MSBs) representative of the normal sound sample and the remaining 16 or 8 bits being padding bits (e.g., bit "0"). The playback of the normal sound may be via one of a plurality of audio output channels (e.g., channel 3 of channel 1~channel 8).

Referring to part (B) of FIG. 1, for audio PCM data containing special sound samples for playback of a special sound (e.g., warning sound), each 32-bit frame of the audio PCM data may be padded, with 16 or 24 MSBs representative of the special sound sample to be sent over an I2S/TDM interface for processing and playback. The remainder of the 32 bits may include 3 bits of control bits (e.g., bit "0" or "1") and 8 or 5 bits of padding bits (e.g., bit "0"). In the example shown in FIG. 1, the 3 bits of control bits may include the following: a first bit of the LSBs being a checksum enable bit, a second bit of the LSBs being a checksum transfer bit, and a third bit of the LSBs being a checksum reset bit. The playback of the normal sound may be via one of a plurality of audio output channels (e.g., channel 3 of channel 1~channel 8). Thus, the playback of the normal sound and the playback of the special sound may be via the same channel (e.g., channel 3). It is noteworthy that, although the 3 bits of control bits are shown to replace 3 LSBs of the padding bits in the example depicted in FIG. 1, in actual implementations the 3 bits of control bits may be scattered among or otherwise mingled with data bits instead of replacing padding bits.

In scheme 100, for the normal sound sample, the checksum enable bit may be "0" and the checksum reset bit may also be "0." Additionally, when one frame containing a special sound sample is followed by a frame containing a normal sound sample, the checksum enable bit may be "0." This may result in a counter for checksum results being reset. Moreover, when one frame containing a special sound sample is followed by another frame containing another special sound sample, the checksum enable bit may be "1" and the checksum reset bit may be "0." This may result in the checksum result being updated and the CRC calculated value for checksum results being accumulated. Furthermore, when the frame to be processed for playback contains the last special sound sample of a series of special sound samples, the checksum enable bit may be "1" and the checksum transfer bit may be "1." This may result in the checksum result being reported for comparison or determination of fault or corruption in the audio PCM data. Alternatively, with the checksum enable bit being "1" and the checksum reset bit being "1," this may result in the checksum not being accumulated and reset to initial value.

Figure 2:
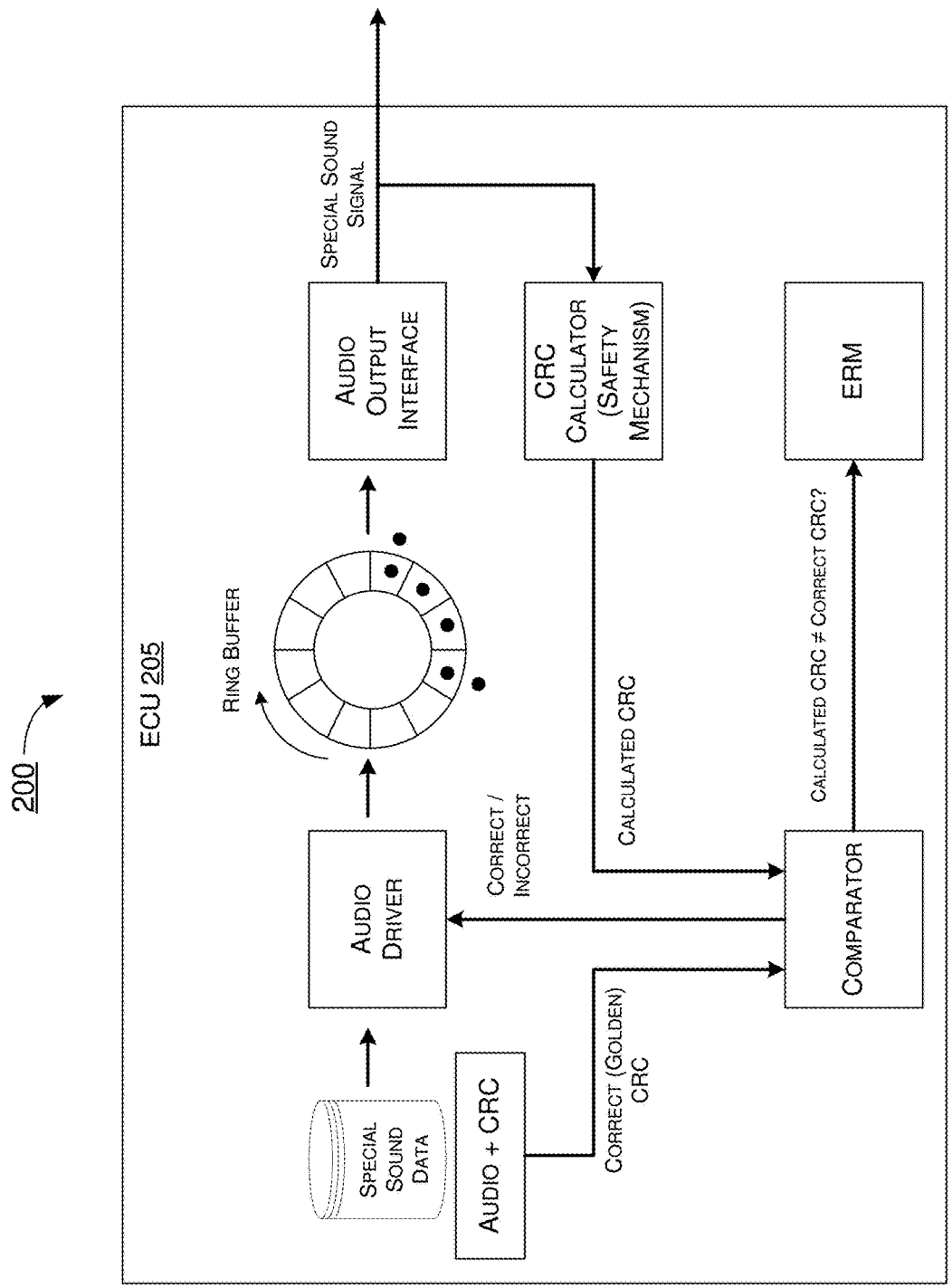
FIG. 2 is a diagram of an example design in accordance with an implementation of the present disclosure.

FIG. 2 illustrates an example design 200 capable of implementing scheme 100 for audio output monitoring for failure detection of warning sound playback in accordance with various proposed schemes of the present disclosure. Design 200 may be implemented in an apparatus such as an electronic control unit (ECU) 205 in an automobile. In design 200, audio PCM data containing special sound samples of a special sound (e.g., warning sound) may be stored in a data storage (e.g., memory or registers). A correct or golden CRC checksum may also be stored in the data storage. In operation, an audio driver may retrieve the audio PCM data to buffer special sound samples in the audio PCM data in a circular buffer or ring buffer to be amplified by an audio output interface for playback.

In design 200, a safety mechanism, which may include a CRC calculator, may obtain the processed special sound samples (e.g., from the output of the audio output interface) to calculate a CRC checksum for the special sound samples. A comparator may retrieve the correct or golden CRC checksum from the data storage and receive the calculated CRC checksum from the CRC calculator for comparison to determine whether there is fault or corruption in the audio PCM data. For instance, in an event that the calculated CRC checksum is not equal to the correct or golden CRC checksum, the comparator may determine that there is fault/corruption in the audio PCM data and, thus, may send a signal to an error response module (ERM) for further operations (e.g., to cause playback of a previous special sound sample in lieu of a current special sound sample which is deemed to be corrupt). Additionally, the comparator may output a report back to the audio driver to indicate whether the calculated CRC checksum is correct or incorrect.

Figure 3:
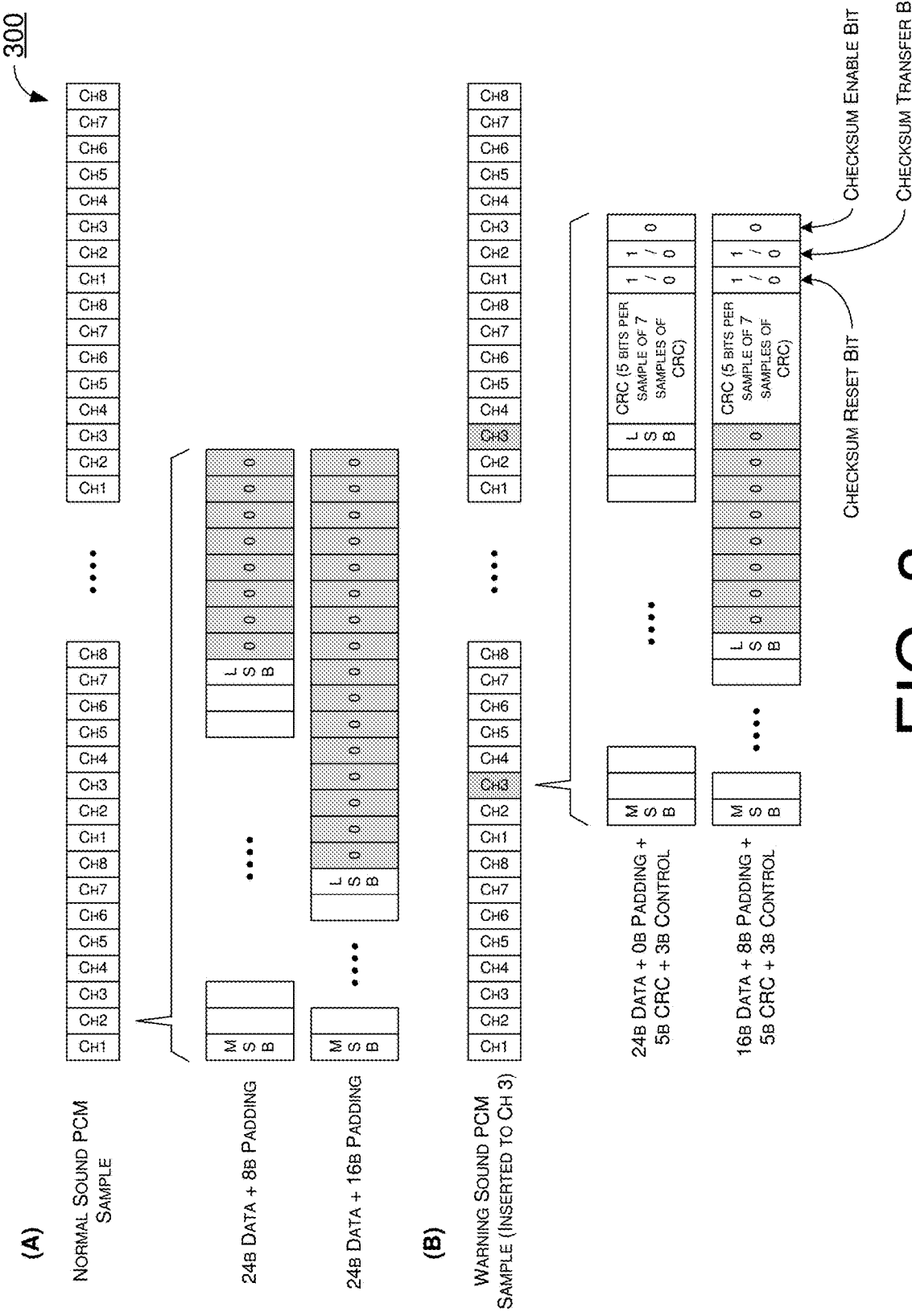
FIG. 3 is a diagram of an example scheme in accordance with an implementation of the present disclosure.

FIG. 3 illustrates an example scheme 300 in accordance with an implementation of the present disclosure. Specifically, part (A) of FIG. 3 shows audio PCM data of a normal sound sample, and part (B) of FIG. 3 shows audio PCM data of a special sound sample under a proposed scheme in accordance with an implementation of the present disclosure. Referring to part (A) of FIG. 3, for audio PCM data containing normal sound samples for playback of a normal sound, each 32-bit frame of the audio PCM data may be padded, with 16 or 24 MSBs representative of the normal sound sample and the remaining 16 or 8 bits being padding bits (e.g., bit "0"). The playback of the normal sound may be via one of a plurality of audio output channels (e.g., channel 3 of channel 1~channel 8).

Referring to part (B) of FIG. 3, for audio PCM data containing special sound samples for playback of a special sound (e.g., warning sound), each 32-bit frame of the audio PCM data may be padded, with 16 or 24 MSBs representative of the special sound sample to be sent over an I2S/TDM interface for processing and playback. The remainder of the 32 bits may include 5 bits of CRC bits, 3 bits of control bits (e.g., bit "0" or "1") and, optionally, padding bits (e.g., bit "0"). In the example shown in FIG. 3, the 3 bits of control bits may include the following: a first bit of the LSBs being a checksum enable bit, a second bit of the LSBs being a checksum transfer bit, and a third bit of the LSBs being a checksum reset bit. The playback of the normal sound may be via one of a plurality of audio output channels (e.g., channel 3 of channel 1~channel 8). Thus, the playback of the normal sound and the playback of the special sound may be via the same channel (e.g., channel 3). It is noteworthy that, although the 5 bits of CRC bits and the 3 bits of control bits are shown to replace 8 LSBs of the padding bits in the example depicted in FIG. 3, in actual implementations the 5 bits of CRC bits and/or the 3 bits of control bits may be scattered among or otherwise mingled with data bits instead of replacing padding bits.

In scheme 300, a 32-bit CRC value may be divided and padded into 7 frames of audio PCM data containing special sound samples. For instance, 5 bits of the 32 bits of the CRC value may be padded into 7 frames of audio PCM data containing special sound samples. Thus, by extracting or otherwise obtaining the respective 5 bits of the 32-bit CRC value from each of the 7 frames, the 32-bit CRC value may be obtained and used for determining the integrity or validity of a calculated checksum result (e.g., a checksum result calculated form the 7 frames of audio PCM data containing special sound samples). Accordingly, there would be no need to retrieve the correct or golden CRC checksum from a data storage (e.g., one that stores the audio PCM data).

In scheme 300, for the normal sound sample, the checksum enable bit may be "0" and the checksum reset bit may also be "0." Additionally, when one frame containing a special sound sample is followed by a frame containing a normal sound sample, the checksum enable bit may be "0." This may result in a counter for checksum results being reset. Moreover, when one frame containing a special sound sample is followed by another frame containing another special sound sample, the checksum enable bit may be "1" and the checksum reset bit may be "0." This may result in the checksum result being updated and the CRC calculated value for checksum results being accumulated. Furthermore, when the frame to be processed for playback contains the last special sound sample of a series of special sound samples, the checksum enable bit may be "1" and the checksum transfer bit may be "1." This may result in the checksum result being reported for comparison or determination of fault or corruption in the audio PCM data. Alternatively, with the checksum enable bit being "1" and the checksum reset bit being "1," this may result in the checksum not being accumulated and reset to initial value.

Figure 4:
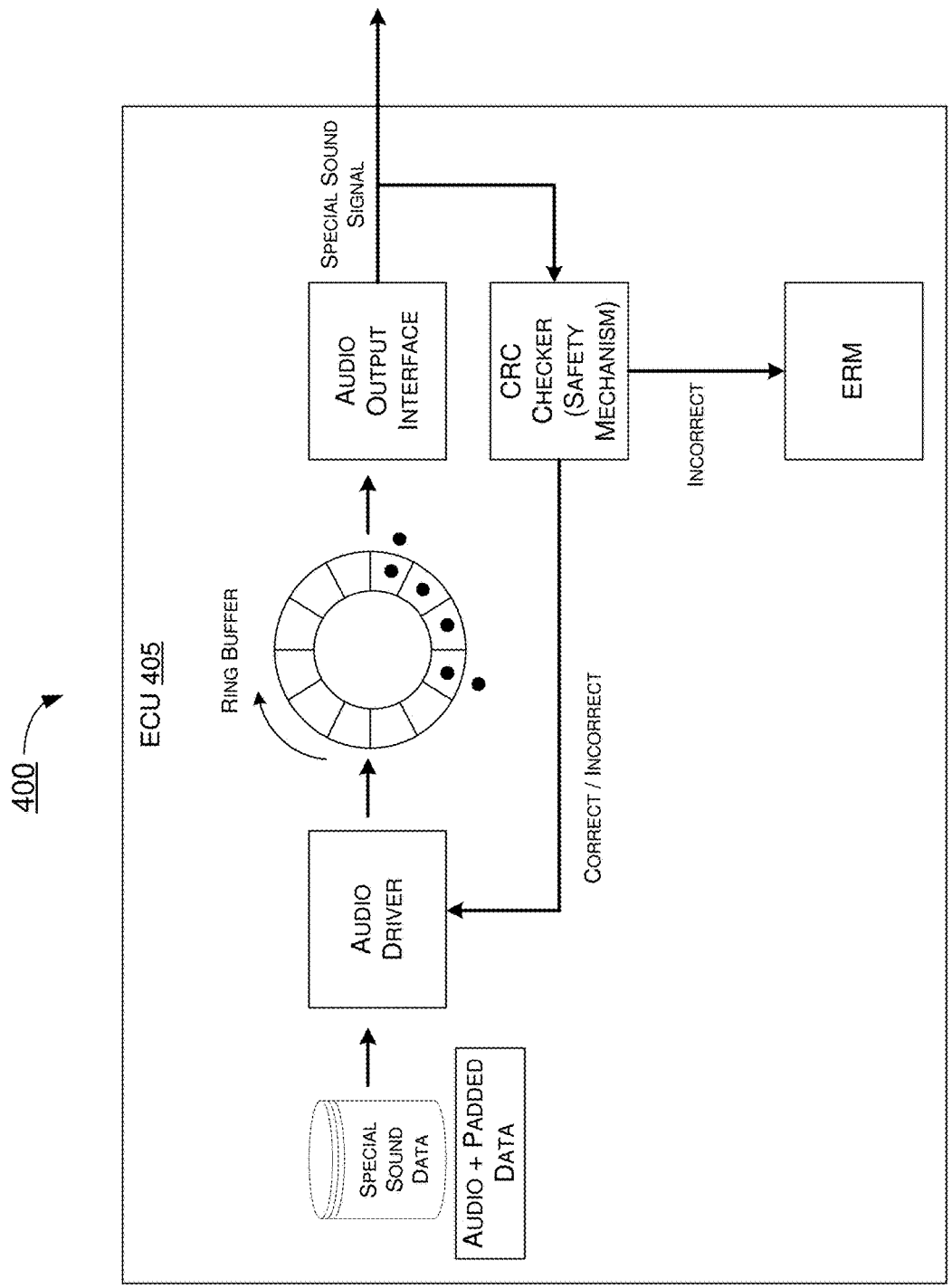
FIG. 4 is a diagram of an example design in accordance with an implementation of the present disclosure.

FIG. 4 illustrates an example design 400 capable of implementing scheme 300 for audio output monitoring for failure detection of warning sound playback in accordance with various proposed schemes of the present disclosure. Design 400 may be implemented in an apparatus such as an ECU 405 in an automobile. In design 400, audio PCM data containing special sound samples of a special sound (e.g., warning sound) may be stored in a data storage (e.g., memory or registers). The stored audio PCM data may contain CRC bits as described above with respect to scheme 300. In operation, an audio driver may retrieve the audio PCM data to buffer special sound samples in the audio PCM data in a circular buffer or ring buffer to be amplified by an audio output interface for playback.

In design 400, a safety mechanism, which may include a CRC checker, may obtain the processed special sound samples (e.g., from the output of the audio output interface) to calculate a CRC checksum for the special sound samples. The CRC checker may also obtain the correct or golden CRC checksum by piecing together segments (e.g., 5-bit segments) of the correct CRC checksum contained in the audio PCM data (e.g., in 7 frames). The CRC checker may then compare the calculated CRC checksum with the correct CRC checksum to determine whether there is fault or corruption in the audio PCM data. In an event that the calculated CRC checksum is not equal to the correct or golden CRC checksum, the CRC checker may determine that there is fault/corruption in the audio PCM data and, thus, may send a signal to an ERM for further operations (e.g., to cause playback of a previous special sound sample in lieu of a current special sound sample which is deemed to be corrupt). For instance, in an event that the calculated CRC checksum is incorrect, the CRC checker may send the signal to the ERM; otherwise, in an event that the calculated CRC checksum is correct, there may be no need for the CRC checker to provide a signal to the ERM. Moreover, the CRC checker may output a report back to the audio driver to indicate whether the calculated CRC checksum is correct or incorrect.

Figure 5:
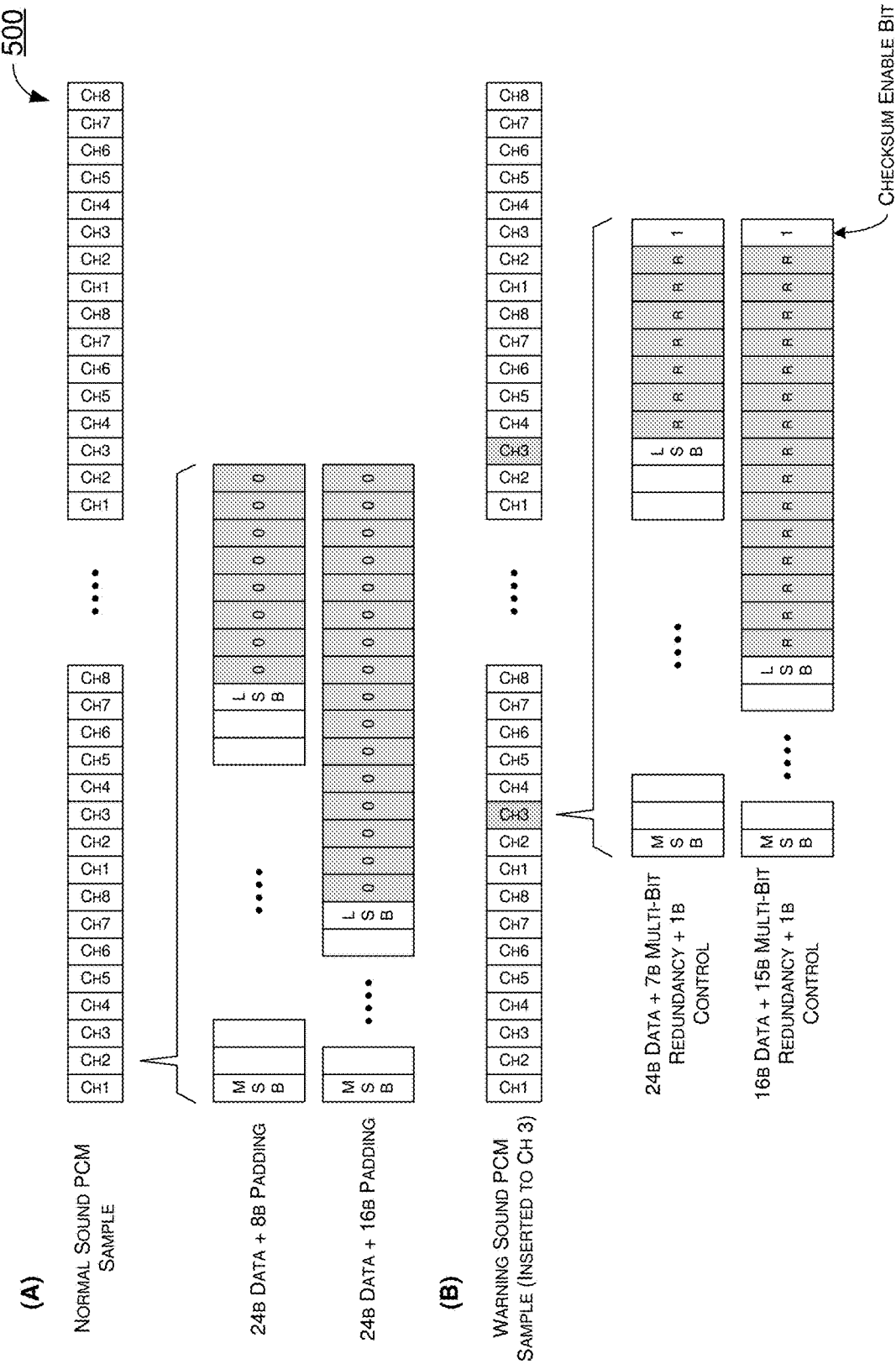
FIG. 5 is a diagram of an example scheme in accordance with an implementation of the present disclosure.

FIG. 5 illustrates an example scheme 500 in accordance with an implementation of the present disclosure. Specifically, part (A) of FIG. 5 shows audio pulse-code modulation (PCM) data of a normal sound sample, and part (B) of FIG. 5 shows audio PCM data of a special sound sample under a proposed scheme in accordance with an implementation of the present disclosure. Referring to part (A) of FIG. 5, for audio PCM data containing normal sound samples for playback of a normal sound, each 32-bit frame of the audio PCM data may be padded, with 16 or 24 MSBs representative of the normal sound sample and the remaining 16 or 8 bits being padding bits (e.g., bit "0"). The playback of the normal sound may be via one of a plurality of audio output channels (e.g., channel 3 of channel 1~channel 8).

Referring to part (B) of FIG. 5, for audio PCM data containing special sound samples for playback of a special sound (e.g., warning sound), each 32-bit frame of the audio PCM data may be padded, with 16 or 24 MSBs representative of the special sound sample to be sent over an I2S/TDM interface for processing and playback. The remainder of the 32 bits may include 1 bit of control bit (e.g., bit "0" or "1") and 7 or 15 bits of multi-bit redundancy bits (e.g., shown as bit "R" in FIG. 5). That is, for 24-bit data, there may be 7 multi-bit redundancy bits plus 1 control bit. Similarly, for 16-bit data, there may be 15 multi-bit redundancy bits plus 1 control bit. In the example shown in FIG. 5, the 1 bits of control bit may include a checksum enable bit as the LSB. The playback of the normal sound may be via one of a plurality of audio output channels (e.g., channel 3 of channel 1~channel 8). Thus, the playback of the normal sound and the playback of the special sound may be via the same channel (e.g., channel 3). It is noteworthy that, although the 7 or 15 bits of multi-bit redundancy bits and the 1 bit of control bit are shown to replace 8 or 16 LSBs of the padding bits in the example depicted in FIG. 5, in actual implementations the 7 or 15 bits of multi-bit redundancy bits and/or the 1 bit of control bit may be scattered among or otherwise mingled with data bits instead of replacing padding bits. It is also noteworthy that, in some implementations, one or more of the 7 or 15 bits of multi-bit redundancy bits may be control bit(s) as those described above with respect to scheme 100 and/or scheme 300.

In scheme 500, for the normal sound sample, the checksum enable bit may be "0." Additionally, when one frame containing a special sound sample is followed by a frame containing a normal sound sample, the checksum enable bit may be "0." This may result in a counter for checksum results being reset. Moreover, when one frame containing a special sound sample is followed by another frame containing another special sound sample, the checksum enable bit may be "1." This may result in the checksum result being updated and the CRC calculated value for checksum results being accumulated. Furthermore, when the frame to be processed for playback contains the last special sound sample of a series of special sound samples, the checksum enable bit may be "1." This may result in the checksum result being reported for comparison or determination of fault or corruption in the audio PCM data.

Figure 6:
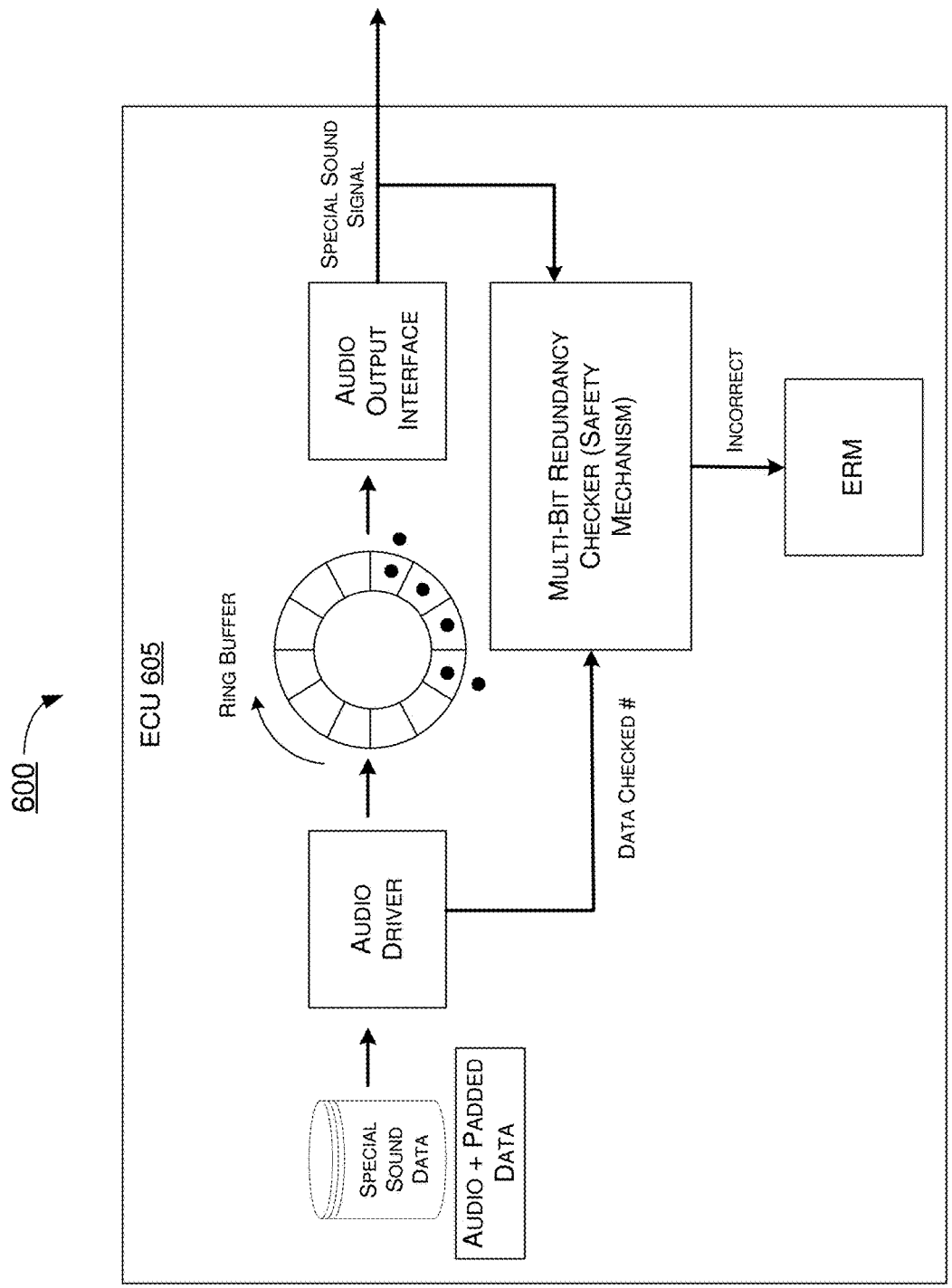
FIG. 6 is a diagram of an example design in accordance with an implementation of the present disclosure.

FIG. 6 illustrates an example design 600 capable of implementing scheme 300 for audio output monitoring for failure detection of warning sound playback in accordance with various proposed schemes of the present disclosure. Design 600 may be implemented in an apparatus such as an ECU 605 in an automobile. In design 600, audio PCM data containing special sound samples of a special sound (e.g., warning sound) may be stored in a data storage (e.g., memory or registers). The stored audio PCM data may contain CRC bits as described above with respect to scheme 500. In operation, an audio driver may retrieve the audio PCM data to buffer special sound samples in the audio PCM data in a circular buffer or ring buffer to be amplified by an audio output interface for playback.

In design 600, a safety mechanism, which may include a multi-bit redundancy checker, may obtain the processed special sound samples (e.g., from the output of the audio output interface) to calculate a multi-bit redundancy checksum for the special sound samples. For instance, the multi-bit redundancy checker may utilize hamming code in performing multi-bit redundancy check. One difference between hamming code and CRC is that the length of an input data for multi-bit redundancy check with hamming code can be less than 32 bits. Thus, even with the input data shorter than 32 bits, error detection may still be performed with, for example and without limitation, 5 bits or 7 bits of hamming code. In cases in which one or more of the multi-bit redundancy bits include one or more control bits, such control bit(s) may be utilized as described above with respect to scheme 100 and/or scheme 300. Accordingly, multiple pieces of PCM data may be connected together for integrity check on the multiple pieces PCM data tougher, as opposed to performing integrity check on individual pieces of PCM data in a one-by-one fashion, thereby achieving improved efficiency and enhanced performance. Moreover, the audio driver may inquire the multi-bit redundancy checker about the number of integrity checks that have been performed (denoted as "data check #" in FIG. 6). In an event that the calculated redundancy checksum is incorrect, the multi-bit redundancy checker may determine that there is fault/corruption in the audio PCM data and, thus, may send a signal to an ERM for further operations (e.g., to cause playback of a previous special sound sample in lieu of a current special sound sample which is deemed to be corrupt).

It is noteworthy that, the function of the safety mechanism in each of design 200, design 400 and design 600 may be extended to include one or more other functions such as, for example and without limitation, cross-correlation and/or spectrum analysis.

For instance, the safety mechanism may include a cross-correlation/spectrum analysis component configured to determine if the audio data in an audio input buffer (e.g., circular buffer or ring buffer) includes a reference signal. In such cases, the cross-correlation/spectrum analysis component may cross-correlate a copy of the reference signal (e.g., stored in a data storage such as memory or registers) with the audio data, with a result of a cross-correlation algorithm indicating whether or not the audio data includes the reference signal. Alternatively, or additionally, the cross-correlation/spectrum analysis component may perform a spectrum analysis of the audio data in the frequency domain and compare the frequency spectrum of the audio data to a known frequency spectrum of the reference signal. In an event that the audio data includes frequency components of the reference signal, then the cross-correlation/spectrum analysis component may determine that the audio data includes the reference signal; otherwise, the cross-correlation/spectrum analysis component may determine that the audio data does not include the reference signal. In an event that the cross-correlation/spectrum analysis component determines that the audio data in audio input buffer includes the reference signal, then the function of the respective ECU (e.g., ECU 205, ECU 405 and/or ECU 605) may continue as normal.

In an event that the cross-correlation/spectrum analysis component determines that the audio data in audio input buffer does not include the reference signal, the safety mechanism may send an indication to the ERM to start a fault process. This is because, under such circumstances, the special sound audio (e.g., warning sound) may not have been played back correctly as there may be some error in the audio output path of the signal including the warning sound that corrupted the combined signal along the audio output path such that the original reference signal is not included. Similarly, the cross-correlation/spectrum analysis component may further be configured to check the data quality of audio data in audio input buffer for distortion or corruption. In an event that analysis of the audio indicates distortion or corruption, then the safety mechanism may send an indication to the ERM to start a fault process. This is because the special sound audio (e.g., warning sound) may not have been played back correctly as there may be some error in the audio output path of the safety sound that corrupted the combined signal including the safety sound along the audio output path.

Illustrative Implementations

Figure 7:
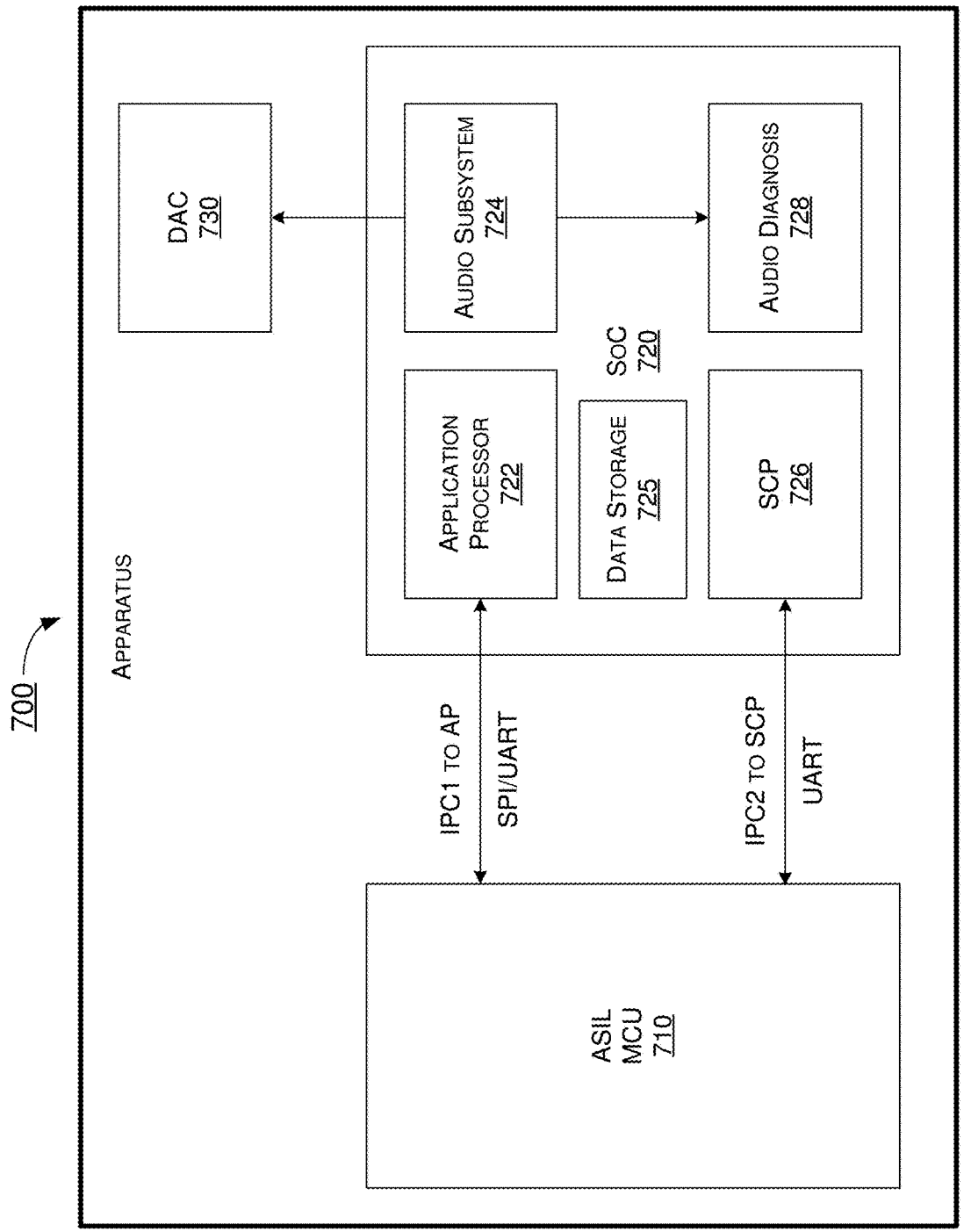
FIG. 7 is a block diagram of an example apparatus in accordance with an implementation of the present disclosure.

FIG. 7 illustrates an example apparatus 700 in accordance with an implementation of the present disclosure. Apparatus 700 may perform various functions and/or operations to implement schemes, techniques, processes and methods described herein pertaining to audio output monitoring for failure detection of warning sound playback, including the various designs and schemes described above with respect to FIG. 1~FIG. 6 and any variations thereof, as well as various scenarios and processes described below with respect to FIG. 8~FIG. 11 and any variations thereof.

Referring to FIG. 7, apparatus 700 may include an Automotive Safety Integrity Levels (ASIL) microcontroller (MCU) 710, a system-on-chip (SoC) 720 and a digital-to-analog converter (DAC) 730. SoC 720 may be coupled to and in communication with each of ASIL MCU 710 and DAC 730. SoC 720 may include an application processor (AP) 722, an audio subsystem circuit 724, a system control processor (SCP) 726, an audio diagnosis circuit 728 and a data storage 725. AP 722 may be coupled to and in communication with ASIL MCU 710 via a first inter-processor communications (IPC) bus (labeled as "IPC1" in FIG. 7) using one or more suitable protocols such as, for example and without limitation, the Serial Peripheral Interface (SPI) protocol and the Universal Asynchronous Receiver/Transmitter (UART) protocol. SCP 726 may be coupled to and in communication with ASIL MCU 710 via a second IPC bus (labeled as "IPC2" in FIG. 7) using one or more suitable protocols such as, for example and without limitation, the UART protocol. In the context of automobiles, apparatus 700 may be implemented in or as a part of an ECU. Thus, apparatus 700 may be an example implantation of ECU 205, ECU 405 and/or ECU 605.

Apparatus 700 may include at least some of those components shown in FIG. 7 as well as one or more other components not pertinent to the proposed schemes of the present disclosure. Thus, such component(s) of apparatus 700 are neither shown in FIG. 7 nor described below in the interest of simplicity and brevity.

Apparatus 700 may be implemented in the form of one or more integrated-circuit (IC) chips such as, for example and without limitation, one or more single-core processors, one or more multi-core processors, or one or more complex-instruction-set-computing (CISC) processors. Thus, even though a singular term "a processor" is used herein to refer to apparatus 700, apparatus 700 may include multiple processors in some implementations and a single processor in other implementations in accordance with the present disclosure. In one aspect, apparatus 700 may be implemented in the form of hardware (and, optionally, firmware) with electronic components including, for example and without limitation, one or more transistors, one or more diodes, one or more capacitors, one or more resistors, one or more inductors, one or more memristors and/or one or more varactors that are configured and arranged to achieve specific purposes in accordance with the present disclosure. In other words, in at least some implementations, apparatus 700 may be a special-purpose machine specifically designed, arranged and configured to perform specific tasks including those pertaining to audio output monitoring for failure detection of warning sound playback in accordance with various implementations of the present disclosure.

Under various proposed schemes in accordance with the present disclosure, audio diagnosis circuit 728 may calculate checksum of each or select audio PCM data to be outputted or played back via one specific audio output channel (e.g., an I2S/TDM output port). The I2S/TDM output port and the specific channel for playback of a special sound (e.g., warning sound) may be configured to a special monitor mode. Under various proposed schemes in accordance with the present disclosure (e.g., scheme 100 and scheme 300 described above), the audio PCM data may be padded to 32 bits with 16 or 24 MSBs representative of a special sound sample (e.g., warning sound) and 3 LSBs of control bits for enabling checksum calculation on the audio sample and for restarting the checksum calculation. Under various proposed schemes in accordance with the present disclosure, when the special sound sample is to be played back, ASIL MCU 710 may receive a checksum result and a counter (e.g., from audio diagnosis circuit 728 via SCP 726) regarding a given frame of audio PCM data to be played back to compare the checksum result with a pre-defined golden or correct checksum value.

Under a proposed scheme for audio output monitoring for failure detection of warning sound playback in accordance with the present disclosure, apparatus 700 (e.g., AP 722) may retrieve first audio data from data storage 725. The first audio data may include a plurality of bits of a first sound sample and one or more control bits for integrity check. Moreover, apparatus 700 (e.g., AP 722, audio subsystem circuit 724, audio diagnosis circuit 728, SCP 726 and DAC 730) may process the first audio data. In processing the first data, apparatus 700 may perform some operations including, for example and without limitation, (i) performing a integrity check on the first sound sample based on the one or more control bits; and (ii) playing back (e.g., by audio subsystem 724 and DAC 730) a first sound (e.g., warning sound) using the first sound sample.

In some implementations, the first audio data may include 32 bits which may include either: (i) 24 bits of the first sound sample, 5 bits of padding and 3 control bits; or (ii) 16 bits of the first sound sample, 13 bits of padding and 3 control bits. In some implementations, the 24 or 16 bits of the first sound sample may include 24 or 16 MSBs of the first audio data. Additionally, the 3 control bits may include 3 LSBs of the first audio data. Moreover, the first audio data may include audio PCM data. In some implementations, the 3 control bits may include a checksum enable bit, a checksum transfer bit and a checksum reset bit. In such cases, in performing the integrity check on the first sound sample, apparatus 700 may perform some operations. For instance, apparatus 700 (e.g., audio diagnosis circuit 728) may calculate a CRC checksum using at least the 24 or 16 bits of the first sound sample from the retrieved first audio data. Moreover, apparatus 700 (e.g., audio diagnosis circuit 728) may retrieve a correct CRC checksum for the first sound sample from data storage 725. Furthermore, apparatus 700 (e.g., ASIL MCU 710) may compare the calculated CRC checksum and the correct CRC checksum to determine whether the first sound sample is corrupt. In some implementations, a checksum algorithm used in calculating the CRC checksum may include CRC32 or modular sum.

Alternatively, the first audio data may include 32 bits which may include either: (a) 24 bits of the first sound sample, 5 bits of CRC bits and 3 control bits; or (b) 16 bits of the first sound sample, 8 bits of padding, 5 bits of the CRC bits and 3 control bits. In some implementations, the 24 or 16 bits of the first sound sample may include 24 or 16 MSBs of the first audio data. Additionally, the 3 control bits may include 3 LSBs of the first audio data. Moreover, the first audio data may include audio PCM data. In some implementations, the 3 control bits may include a checksum enable bit, a checksum transfer bit and a checksum reset bit. In such cases, in performing the integrity check on the first sound sample, apparatus 700 may perform some operations. For instance, apparatus 700 (e.g., audio diagnosis circuit 728) may calculate a CRC checksum using at least the 24 or 16 bits of the first sound sample from the retrieved first audio data. Moreover, apparatus 700 (e.g., audio diagnosis circuit 728) may retrieve a correct CRC checksum for the first sound sample from data storage 725. Furthermore, apparatus 700 (e.g., ASIL MCU 710) may compare the calculated CRC checksum and the correct CRC checksum to determine whether the first sound sample is corrupt. In some implementations, a checksum algorithm used in calculating the CRC checksum may include CRC32 or modular sum.

In some implementations, the first audio data may include 32 bits which may include either: (i) 24 bits of the first sound sample, 7 bits of multi-bit redundancy and 1 control bit; or (ii) 16 bits of the first sound sample, 15 bits of multi-bit redundancy and 1 control bit. In some implementations, the 24 or 16 bits of the first sound sample may include 24 or 16 MSBs of the first audio data. Additionally, the 7 or 15 bits of multi-bit redundancy and 1 control bit may include 8 or 16 LSBs of the first audio data. Moreover, the first audio data may include audio PCM data. In some implementations, the 1 control bit may include a checksum enable bit. In such cases, in performing the integrity check on the first sound sample, apparatus 700 may perform some operations. For instance, apparatus 700 may calculate a multi-bit redundancy checksum with a hamming code using at least the 24 or 16 bits of the first sound sample from the retrieved first audio data. Moreover, apparatus 700 (e.g., ASIL MCU 710) may determine whether the calculated multi-bit redundancy is correct to determine whether the first sound sample is corrupt.

In some implementations, apparatus 700 may perform additional operations. For instance, apparatus 700 (e.g., AP 722) may retrieve second audio data different from the first audio data from data storage 725. The second audio data may include a plurality of bits of a second sound sample with or without padding. Moreover, apparatus 700 (e.g., AP 722, audio subsystem circuit 724, audio diagnosis circuit 728, SCP 726 and DAC 730) may process the second audio data to play back a second sound (e.g., normal sound) different from the first sound using the second sound sample. In such cases, in playing back the first sound and the playing back of the second sound, apparatus 700 (e.g., audio subsystem circuit 724 and DAC 730) may play back the first sound and the second sound using a same channel (e.g., channel 3 of out channel 1~channel 8).

In some implementations, in playing back the first sound and the second sound using the same channel, apparatus 700 may adjust the playing back of the second sound while the first sound is being played back. In some implementations, in adjusting the playing back of the second sound, apparatus 700 may perform at least one of the following: (a) pausing the playing back of the second sound; (b) replacing the playing back of the second sound with playing back of the first sound; and (c) lowering a volume of the playing back of the second sound.

An example pseudocode pertaining to audio output monitoring for failure detection of warning sound playback (e.g., implementable by apparatus 700) may be as follows:

```
process_audio_frame( ) // implemented in hardware
{
    if (cksum_enabled) {
        // push the audio data to CRC context to calculate an accumulate
        result
        update_data_to_crc_context( );
    }
    if (cksum_transfer) {
        // increment checksum counter, and post current CRC
        // along with the counter value to be verified
        crc_counter++;
        post_crc_result(crc_counter, crc_result);
    }
    if (cksum_reset) {
        // checksum reset bit set to 1 to reset counter and CRC context
        crc_counter = 0;
        reset_crc_context( );
    }
    play_audio( ); // play the audio data, either normal sound or critical
    sound
}
```

It is noteworthy that there may be latency in audio ping-pong buffer. That is, the latency may be introduced by the use of double buffering (e.g., with a first buffer and a second buffer). Typically, the amount of data that can be buffered in a buffer may be equivalent to approximately 40 milliseconds (ms) of playback time. In an event that a channel dedicated for playback of a special sound (e.g., warning sound), there may be no head of line blocking. In an event that the channel is also used for playback of a normal sound (e.g., music playing), with double buffering, the maximum latency may be two times the playback time for two full buffers, which is about 80 ms. In apparatus 700, SCP 726 may report to ASIL MCU 710 a latency caused by sample timing.

To avoid latency, in an event that the playback of a special sound and the playback of a normal sound are via a same channel, the playback of the normal sound may be adjusted. In some implementations, with respect to adjusting the playback of the normal sound while the special sound is being played back, the playback of the normal sound may be paused. Alternatively, or additionally, with respect to adjusting the playback of the normal sound while the special sound is being played back, the playback of the normal sound may be replaced by the playback of the special sound. Still alternatively, or additionally, with respect to adjusting the playback of the normal sound while the special sound is being played back, the volume of the playback of the normal sound may be lowered (e.g., to minimize interference with the playback of the special sound).

Figure 8:
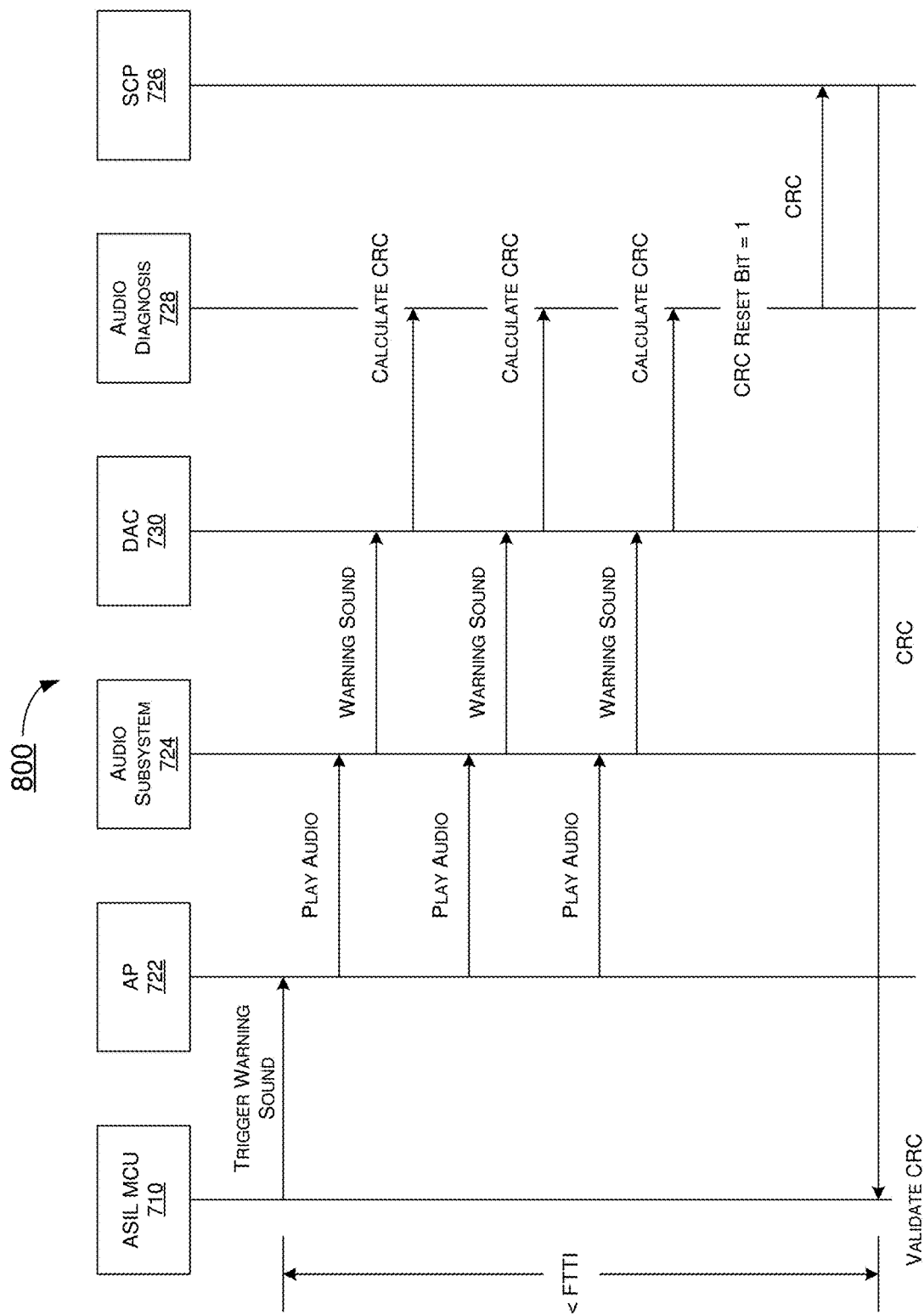
FIG. 8 is a diagram of an example operation in accordance with an implementation of the present disclosure.

FIG. 8 illustrates an example operation 800 of apparatus 700 in accordance with an implementation of the present disclosure. Operation 800 may pertain to playback of a special sound (e.g., warning sound). Operation 800 may start with ASIL MCU 710 sending a trigger signal for playback of the special sound (e.g., via the IPC1 bus) to AP 722, which may in turn send signals for audio playback to audio subsystem circuit 724. Correspondingly, from each frame of one or more frames of audio PCM data, audio subsystem circuit 724 may obtain a special sound sample and provide the special sound sample to DAC 730 for playback. Additionally, audio subsystem circuit 724 may also obtain control bits (and, optionally, CRC bits) and provide the control bits (and, optionally, the CRC bits) to audio diagnosis circuit 728. Audio diagnosis circuit 728 may calculate a respective CRC checksum result for each frame of the audio PCM data, and audio diagnosis circuit 728 may send each calculated CRC checksum result to SCP 726. Audio diagnosis circuit 728 may reset a counter when the checksum reset bit in the control bits is 1. SCP 726 may forward the calculated CRC checksum result to ASIL MCU 710 (e.g., via the IPC2 bus) for validation. That is, ASIL MCU 710 may compare the calculated CRC checksum result with a correct (golden) CRC checksum for the respective frame to determine whether the calculated CRC checksum result is valid or invalid. From beginning to end, the duration of operation 800 may be less than a fault tolerant time interval (FTTI) for the operation.

Figure 9:
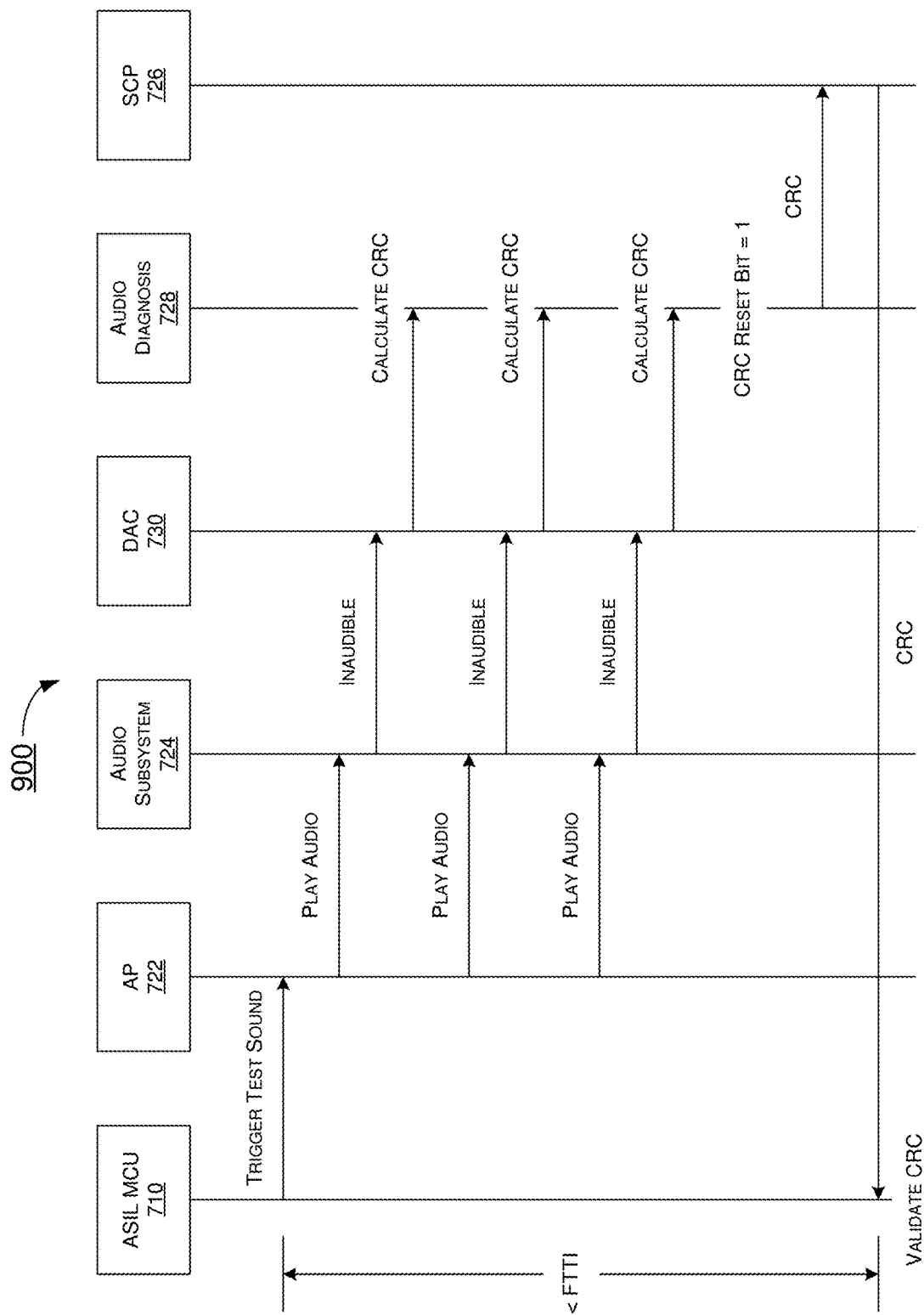
FIG. 9 is a diagram of an example operation in accordance with an implementation of the present disclosure.

FIG. 9 illustrates an example operation 900 of apparatus 700 in accordance with an implementation of the present disclosure. Operation 900 may pertain to an audio test pattern (e.g., for testing the operation of apparatus 700). Operation 900 may start with ASIL MCU 710 sending a trigger signal for playback of a test (inaudible) sound (e.g., via the IPC1 bus) to AP 722, which may in turn send signals for audio playback to audio subsystem circuit 724. Correspondingly, from each frame of one or more frames of audio PCM data, audio subsystem circuit 724 may obtain a test sound sample and provide the test sound sample to DAC 730 for playback. Additionally, audio subsystem circuit 724 may also obtain control bits (and, optionally, CRC bits) and provide the control bits (and, optionally, the CRC bits) to audio diagnosis circuit 728. Audio diagnosis circuit 728 may calculate a respective CRC checksum result for each frame of the audio PCM data, and audio diagnosis circuit 728 may send each calculated CRC checksum result to SCP 726. Audio diagnosis circuit 728 may reset a counter when the checksum reset bit in the control bits is 1. SCP 726 may forward the calculated CRC checksum result to ASIL MCU 710 (e.g., via the IPC2 bus) for validation. That is, ASIL MCU 710 may compare the calculated CRC checksum result with a correct (golden) CRC checksum for the respective frame to determine whether the calculated CRC checksum result is valid or invalid. From beginning to end, the duration of operation 900 may be less than a FTTI for the operation.

Figure 10:
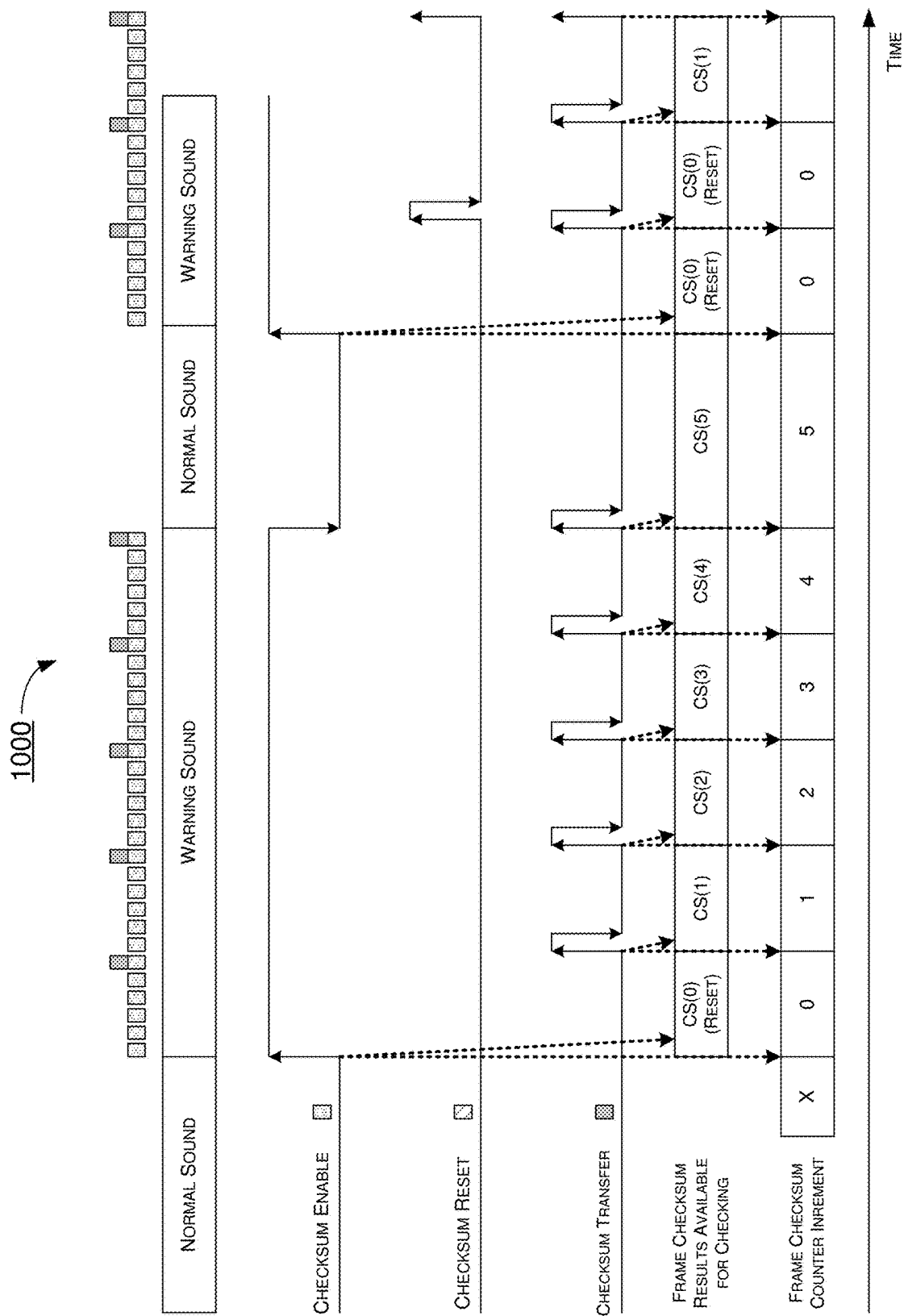
FIG. 10 is a diagram of an example scenario of hardware implementation of various proposed schemes in accordance with the present disclosure.

FIG. 10 illustrates an example scenario 1000 of hardware implementation of various proposed schemes in accordance with the present disclosure. In scenario 1000, when a special sound (e.g., warning sound) is to be played out, ASIL MCU 710 of apparatus 700 may read back a calculated CRC checksum result for a frame and a respective counter value at a proper time to compare the calculated CRC checksum result with a pre-defined correct or golden CRC checksum.

Referring to FIG. 10, when the checksum enable bit is set to "1", the hardware (e.g., apparatus 700) may update a checksum result (e.g., calculated checksum result) and increment a counter automatically. In some implementations, a checksum algorithm in use may be CRC32 or modular sum (e.g., adding all the words and discarding the overflow bits). When the checksum enable bit is rising, the counter may be reset by the hardware. When the checksum transfer bit is rising, the checksum result and counter value of the counter may be updated by the hardware.

Illustrative Processes

Figure 11:
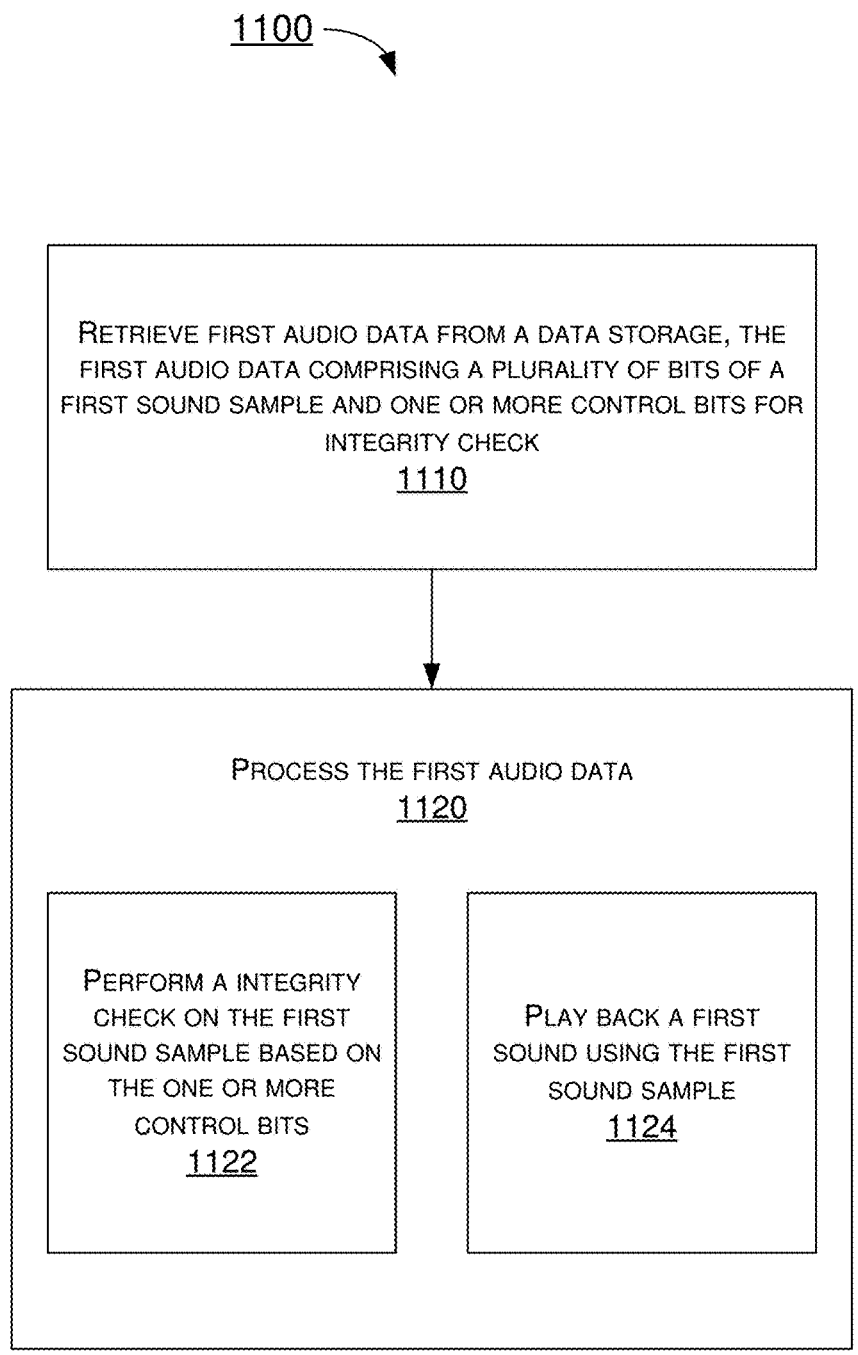
FIG. 11 is a flowchart of an example process in accordance with an implementation of the present disclosure.

FIG. 11 illustrates an example process 1100 in accordance with an implementation of the present disclosure. Process 1100 may represent an aspect of implementing various proposed designs, concepts, schemes, systems and methods described above, whether partially or entirely, including FIG. 1~FIG. 10. More specifically, process 1100 may represent an aspect of the proposed concepts and schemes pertaining to audio output monitoring for failure detection of warning sound playback. Process 1100 may include one or more operations, actions, or functions as illustrated by one or more of blocks 1110 and 1120 as well as sub-blocks 1122 and 1124. Although illustrated as discrete blocks, various blocks of process 1100 may be divided into additional blocks, combined into fewer blocks, or eliminated, depending on the desired implementation. Moreover, the blocks/sub-blocks of process 1100 may be executed in the order shown in FIG. 11 or, alternatively in a different order. Furthermore, one or more of the blocks/sub-blocks of process 1100 may be executed iteratively. Process 1100 may be implemented by or in apparatus 700 as well as any variations thereof. Solely for illustrative purposes and without limiting the scope, process 1100 is described below in the context of apparatus 700. Process 1100 may begin at block 1110.

At 1110, process 1100 may involve apparatus 700 (e.g., AP 722) retrieving first audio data from data storage 725. The first audio data may include a plurality of bits of a first sound sample and one or more control bits for integrity check. Process 1100 may proceed from 1110 to 1120.

At 1120, process 1100 may involve apparatus 700 processing the first audio data. In processing the first data, process 1100 may involve apparatus 700 performing some operations as represented by 1122 and 1124.

At 1122, process 1100 may involve audio diagnosis circuit 728 of apparatus 700 performing an integrity check on the first sound sample based on the one or more control bits.

At 1124, process 1100 may involve audio subsystem 724 and DAC 730 of apparatus 700 playing back a first sound (e.g., warning sound) using the first sound sample.

In some implementations, the first audio data may include 32 bits which may include either: (i) 24 bits of the first sound sample, 5 bits of padding and 3 control bits; or (ii) 16 bits of the first sound sample, 13 bits of padding and 3 control bits. In some implementations, the 24 or 16 bits of the first sound sample may include 24 or 16 MSBs of the first audio data. Additionally, the 3 control bits may include 3 LSBs of the first audio data. Moreover, the first audio data may include audio PCM data. In some implementations, the 3 control bits may include a checksum enable bit, a checksum transfer bit and a checksum reset bit. In such cases, in performing the integrity check on the first sound sample, process 1100 may involve apparatus 700 performing some operations. For instance, process 1100 may involve apparatus 700 calculating a CRC checksum using at least the 24 or 16 bits of the first sound sample from the retrieved first audio data. Moreover, process 1100 may involve apparatus 700 retrieving a correct CRC checksum for the first sound sample from data storage 725. Furthermore, process 1100 may involve apparatus 700 (e.g., ASIL MCU 710) comparing the calculated CRC checksum and the correct CRC checksum to determine whether the first sound sample is corrupt. In some implementations, a checksum algorithm used in calculating the CRC checksum may include CRC32 or modular sum.

Alternatively, the first audio data may include 32 bits which may include either: (a) 24 bits of the first sound sample, 5 bits of CRC bits and 3 control bits; or (b) 16 bits of the first sound sample, 8 bits of padding, 5 bits of the CRC bits and 3 control bits. In some implementations, the 24 or 16 bits of the first sound sample may include 24 or 16 MSBs of the first audio data. Additionally, the 3 control bits may include 3 LSBs of the first audio data. Moreover, the first audio data may include audio PCM data. In some implementations, the 3 control bits may include a checksum enable bit, a checksum transfer bit and a checksum reset bit. In such cases, in performing the integrity check on the first sound sample, process 1100 may involve apparatus 700 performing some operations. For instance, process 1100 may involve apparatus 700 calculating a CRC checksum using at least the 24 or 16 bits of the first sound sample from the retrieved first audio data. Moreover, process 1100 may involve apparatus 700 retrieving a correct CRC checksum for the first sound sample from data storage 725. Furthermore, process 1100 may involve apparatus 700 (e.g., ASIL MCU 710) comparing the calculated CRC checksum and the correct CRC checksum to determine whether the first sound sample is corrupt. In some implementations, a checksum algorithm used in calculating the CRC checksum may include CRC32 or modular sum.

Still alternatively, the first audio data may include 32 bits which may include either: (i) 24 bits of the first sound sample, 7 bits of multi-bit redundancy and 1 control bit; or (ii) 16 bits of the first sound sample, 15 bits of multi-bit redundancy and 1 control bit. In some implementations, the 24 or 16 bits of the first sound sample may include 24 or 16 MSBs of the first audio data. Additionally, the 7 or 15 bits of multi-bit redundancy and 1 control bit may include 8 or 16 LSBs of the first audio data. Moreover, the first audio data may include audio PCM data. In some implementations, the 1 control bit may include a checksum enable bit. In such cases, in performing the integrity check on the first sound sample, process 1100 may involve apparatus 700 performing some operations. For instance, process 1100 may involve apparatus 700 calculating a multi-bit redundancy checksum with a hamming code using at least the 24 or 16 bits of the first sound sample from the retrieved first audio data. Moreover, process 1100 may involve apparatus 700 (e.g., ASIL MCU 710) determining whether the calculated multi-bit redundancy is correct to determine whether the first sound sample is corrupt.

In some implementations, process 1100 may involve apparatus 700 performing additional operations. For instance, process 1100 may involve apparatus 700 retrieving second audio data different from the first audio data from data storage 725. The second audio data may include a plurality of bits of a second sound sample with or without padding. Moreover, process 1100 may involve apparatus 700 processing the second audio data to play back a second sound (e.g., normal sound) different from the first sound using the second sound sample. In such cases, in playing back the first sound and the playing back of the second sound, process 1100 may involve apparatus 700 playing back the first sound and the second sound using a same channel (e.g., channel 3 of out channel 1~channel 8).

In some implementations, in playing back the first sound and the second sound using the same channel, process 1100 may involve apparatus 700 adjusting the playing back of the second sound while the first sound is being played back. In some implementations, in adjusting the playing back of the second sound, process 1100 may involve apparatus 700 performing at least one of the following: (a) pausing the playing back of the second sound; (b) replacing the playing back of the second sound with playing back of the first sound; and (c) lowering a volume of the playing back of the second sound.

Additional Notes

The herein-described subject matter sometimes illustrates different components contained within, or connected with, different other components. It is to be understood that such depicted architectures are merely examples, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected", or "operably coupled", to each other to achieve the desired functionality, and any two components capable of being so associated can also be viewed as being "operably couplable", to each other to achieve the desired functionality. Specific examples of operably couplable include but are not limited to physically mateable and/or physically interacting components and/or wirelessly interactable and/or wirelessly interacting components and/or logically interacting and/or logically interactable components.

Further, with respect to the use of substantially any plural and/or singular terms herein, those having skill in the art can translate from the plural to the singular and/or from the singular to the plural as is appropriate to the context and/or application. The various singular/plural permutations may be expressly set forth herein for sake of clarity.

Moreover, it will be understood by those skilled in the art that, in general, terms used herein, and especially in the appended claims, e.g., bodies of the appended claims, are generally intended as "open" terms, e.g., the term "including" should be interpreted as "including but not limited to," the term "having" should be interpreted as "having at least," the term "includes" should be interpreted as "includes but is not limited to," etc. It will be further understood by those within the art that if a specific number of an introduced claim recitation is intended, such an intent will be explicitly recited in the claim, and in the absence of such recitation no such intent is present. For example, as an aid to understanding, the following appended claims may contain usage of the introductory phrases "at least one" and "one or more" to introduce claim recitations. However, the use of such phrases should not be construed to imply that the introduction of a claim recitation by the indefinite articles "a" or "an" limits any particular claim containing such introduced claim recitation to implementations containing only one such recitation, even when the same claim includes the introductory phrases "one or more" or "at least one" and indefinite articles such as "a" or "an," e.g., "a" and/or "an" should be interpreted to mean "at least one" or "one or more;" the same holds true for the use of definite articles used to introduce claim recitations. In addition, even if a specific number of an introduced claim recitation is explicitly recited, those skilled in the art will recognize that such recitation should be interpreted to mean at least the recited number, e.g., the bare recitation of "two recitations," without other modifiers, means at least two recitations, or two or more recitations. Furthermore, in those instances where a convention analogous to "at least one of A, B, and C, etc." is used, in general such a construction is intended in the sense one having skill in the art would understand the convention, e.g., "a system having at least one of A, B, and C" would include but not be limited to systems that have A alone, B alone, C alone, A and B together, A and C together, B and C together, and/or A, B, and C together, etc. In those instances where a convention analogous to "at least one of A, B, or C, etc." is used, in general such a construction is intended in the sense one having skill in the art would understand the convention, e.g., "a system having at least one of A, B, or C" would include but not be limited to systems that have A alone, B alone, C alone, A and B together, A and C together, B and C together, and/or A, B, and C together, etc. It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

From the foregoing, it will be appreciated that various implementations of the present disclosure have been described herein for purposes of illustration, and that various modifications may be made without departing from the scope and spirit of the present disclosure. Accordingly, the various implementations disclosed herein are not intended to be limiting, with the true scope and spirit being indicated by the following claims.

What is claimed is:

1. A method, comprising:
   retrieving first audio data from a data storage, the first audio data comprising a plurality of bits of a first sound sample and one or more control bits for integrity check; and
   processing the first audio data, the processing comprising:
      performing an integrity check on the first sound sample based on the one or more control bits; and
      playing back a first sound using the first sound sample,
   wherein the one or more control bits comprise one or more of a checksum enable bit, a checksum transfer bit, a checksum reset bit, or a combination thereof.

2. The method of claim 1, wherein the first audio data comprises 32 bits comprising either:
   24 bits of the first sound sample, 5 bits of padding and 3 control bits; or
   16 bits of the first sound sample, 13 bits of padding and 3 control bits.

3. The method of claim 2, wherein the 24 or 16 bits of the first sound sample comprise 24 or 16 most-significant bits (MSBs) of the first audio data, wherein the 3 control bits comprise 3 least-significant bits (LSBs) of the first audio data, and wherein the first audio data comprises audio pulse-code modulated (PCM) data.

4. The method of claim 2, wherein the 3 control bits comprise a checksum enable bit, a checksum transfer bit and a checksum reset bit.

5. The method of claim 4, wherein the performing of the integrity check on the first sound sample comprises:
calculating a cyclic redundancy check (CRC) checksum using at least the 24 or 16 bits of the first sound sample from the retrieved first audio data;
retrieving a correct CRC checksum for the first sound sample from the data storage; and
comparing the calculated CRC checksum and the correct CRC checksum to determine whether the first sound sample is corrupt.

6. The method of claim 1, wherein the first audio data comprises 32 bits comprising either:
24 bits of the first sound sample, 5 bits of cyclic redundancy check (CRC) bits and 3 control bits; or
16 bits of the first sound sample, 8 bits of padding, 5 bits of the CRC bits and 3 control bits.

7. The method of claim 6, wherein the 24 or 16 bits of the first sound sample comprise 24 or 16 most-significant bits (MSBs) of the first audio data, wherein the 3 control bits comprise 3 least-significant bits (LSBs) of the first audio data, and wherein the first audio data comprises audio pulse-code modulated (PCM) data.

8. The method of claim 6, wherein the 3 control bits comprise a checksum enable bit, a checksum transfer bit and a checksum reset bit.

9. The method of claim 8, wherein the performing of the integrity check on the first sound sample comprises:
calculating a CRC checksum using at least the 24 or 16 bits of the first sound sample from the retrieved first audio data;
retrieving a correct CRC checksum for the first sound sample from the data storage; and
comparing the calculated CRC checksum and the correct CRC checksum to determine whether the first sound sample is corrupt.

10. The method of claim 1, wherein the first audio data comprises 32 bits comprising either:
24 bits of the first sound sample, 7 bits of multi-bit redundancy and 1 control bit; or
16 bits of the first sound sample, 15 bits of multi-bit redundancy and 1 control bit.

11. The method of claim 10, wherein the 24 or 16 bits of the first sound sample comprise 24 or 16 most-significant bits (MSBs) of the first audio data, wherein the 7 or 15 bits of multi-bit redundancy and 1 control bit comprise 8 or 16 least-significant bits (LSBs) of the first audio data, and wherein the first audio data comprises audio pulse-code modulated (PCM) data.

12. The method of claim 1, wherein the performing of the integrity check on the first sound sample comprises:
calculating a multi-bit redundancy checksum with a hamming code using at least the 24 or 16 bits of the first sound sample from the retrieved first audio data; and
determining whether the calculated multi-bit redundancy is correct to determine whether the first sound sample is corrupt.

13. The method of claim 1, further comprising:
retrieving second audio data different from the first audio data from the data storage, the second audio data comprising a plurality of bits of a second sound sample; and
processing the second audio data to play back a second sound different from the first sound using the second sound sample,
wherein the playing back of the first sound and the playing back of the second sound comprises playing back the first sound and the second sound using a same channel.

14. The method of claim 13, wherein the playing back of the first sound and the second sound using the same channel comprises adjusting the playing back of the second sound while the first sound is being played back, and wherein the adjusting of the playing back of the second sound comprises performing at least one of:
pausing the playing back of the second sound;
replacing the playing back of the second sound with playing back of the first sound; and
lowering a volume of the playing back of the second sound.

15. An apparatus, comprising:
a data storage storing first audio data and second audio data different from the first audio data, the first audio data comprising a plurality of bits of a first sound sample and one or more control bits for integrity check; and
a circuit coupled to the data storage such that, during operation, the circuit performs operations comprising:
retrieving the first audio data from the data storage; and
processing the first audio data by:
performing an integrity check on the first sound sample based on the one or more control bits; and
playing back a first sound using the first sound sample,
wherein the one or more control bits comprise one or more of a checksum enable bit, a checksum transfer bit, a checksum reset bit, or a combination thereof.

16. The apparatus of claim 15, wherein the first audio data comprises 32 bits comprising either:
24 bits of the first sound sample, 5 bits of padding and 3 control bits; or
16 bits of the first sound sample, 13 bits of padding and 3 control bits,
wherein the 24 or 16 bits of the first sound sample comprise 24 or 16 most-significant bits (MSBs) of the first audio data, wherein the 3 control bits comprise 3 least-significant bits (LSBs) of the first audio data, and wherein the first audio data comprises audio pulse-code modulated (PCM) data,
wherein the 3 control bits comprise a checksum enable bit, a checksum transfer bit and a checksum reset bit, and
wherein, in performing the integrity check on the first sound sample, the circuit performs operations comprising:
calculating a cyclic redundancy check (CRC) checksum using at least the 24 or 16 bits of the first sound sample from the retrieved first audio data;
retrieving a correct CRC checksum for the first sound sample from the data storage; and
comparing the calculated CRC checksum and the correct CRC checksum to determine whether the first sound sample is corrupt.

17. The apparatus of claim 15, wherein the first audio data comprises 32 bits comprising either:

24 bits of the first sound sample, 5 bits of cyclic redundancy check (CRC) bits and 3 control bits; or 16 bits of the first sound sample, 8 bits of padding, 5 bits of the CRC bits and 3 control bits, wherein the 24 or 16 bits of the first sound sample comprise 24 or 16 most-significant bits (MSBs) of the first audio data, wherein the 3 control bits comprise 3 least-significant bits (LSBs) of the first audio data, and wherein the first audio data comprises audio pulse-code modulated (PCM) data, wherein the 3 control bits comprise a checksum enable bit, a checksum transfer bit and a checksum reset bit, and wherein, in performing the integrity check on the first sound sample, the circuit performs operations comprising:

calculating a CRC checksum using at least the 24 or 16 bits of the first sound sample from the retrieved first audio data;

retrieving a correct CRC checksum for the first sound sample from the data storage; and comparing the calculated CRC checksum and the correct CRC checksum to determine whether the first sound sample is corrupt.

18. The apparatus of claim 15, wherein the first audio data comprises 32 bits comprising either:

24 bits of the first sound sample, 7 bits of multi-bit redundancy and 1 control bit; or 16 bits of the first sound sample, 15 bits of multi-bit redundancy and 1 control bit, wherein the 24 or 16 bits of the first sound sample comprise 24 or 16 most-significant bits (MSBs) of the first audio data, wherein the 7 or 15 bits of multi-bit redundancy and 1 control bit comprise 8 or 16 least-significant bits (LSBs) of the first audio data, and wherein the first audio data comprises audio pulse-code modulated (PCM) data, wherein the 1 control bit comprise a checksum enable bit, and wherein, in performing the integrity check on the first sound sample, the circuit performs operations comprising:

calculating a multi-bit redundancy checksum with a hamming code using at least the 24 or 16 bits of the first sound sample from the retrieved first audio data; and determining whether the calculated multi-bit redundancy is correct to determine whether the first sound sample is corrupt.

19. The apparatus of claim 15, wherein, during operation, the circuit further performs operations comprising:

retrieving the second audio data from the data storage, the second audio data comprising a plurality of bits of a second sound sample; and processing the second audio data to play back a second sound different from the first sound using the second sound sample, wherein, in playing back the first sound and playing back the second sound, the circuit plays back the first sound and the second sound using a same channel, wherein, in playing back the first sound and the second sound using the same channel, the circuit adjusts the playing back of the second sound while playing back the first sound, and wherein, in adjusting the playing back of the second sound, the circuit performs at least one of:

pausing the playing back of the second sound;

replacing the playing back of the second sound with playing back of the first sound; and lowering a volume of the playing back of the second sound.

20. A method, comprising:

retrieving first audio data from a data storage, the first audio data comprising a plurality of bits of a first sound sample and a plurality of control bits for integrity check; and processing the first audio data, the processing comprising:

performing an integrity check on the first sound sample based on the plurality of control bits; and playing back a first sound using the first sound sample, wherein the plurality of control bits and one or more optional padding bits are consecutive in location, wherein the plurality of control bits comprise some or all of a checksum enable bit, a checksum transfer bit, a checksum reset bit, or a combination thereof.

* * * * *